US012813317B2

(12) United States Patent
Schmer et al.

(10) Patent No.: US 12,813,317 B2
(45) Date of Patent: Nov. 24, 2026

(54) METHODS FOR FORMING A POWER SEMICONDUCTOR MODULE ARRANGEMENT

(71) Applicant: Infineon Technologies AG, Neubiberg (DE)

(72) Inventors: Alexander Schmer, Soest (DE); Anita Herzer, Kaiserslautern (DE); Hans Hartung, Warstein (DE); Martin Goldammer, Soest (DE)

(73) Assignee: Infineon Technologies AG, Neubiberg (DE)

( * ) Notice: Subject to any disclaimer, the term of this patent is extended or adjusted under 35 U.S.C. 154(b) by 331 days.

(21) Appl. No.: 18/738,124

(22) Filed: Jun. 10, 2024

(65) Prior Publication Data

US 2024/0420968 A1 Dec. 19, 2024

(30) Foreign Application Priority Data

Jun. 13, 2023 (EP) ..................................... 23178918

(51) Int. Cl.
*H10W 74/01* (2026.01)
*H10W 74/10* (2026.01)
(Continued)

(52) U.S. Cl.
CPC .......... *H10W 74/01* (2026.01); *H10W 74/114* (2026.01); *H10W 76/10* (2026.01); *H10W 90/00* (2026.01)

(58) Field of Classification Search
CPC . H10W 42/405; H10W 20/43; H10W 74/012; H10W 74/15; H10W 90/00; H10W 72/5473; H10W 90/20; H10W 90/732; H10W 90/754; H10W 72/354; H10W 72/877; H10W 72/884; H10W 72/931; H10W 90/271; H10W 90/724; H10W 42/40; H10W 72/90–987; H10W 72/019–0198; H10W 80/00–754;
(Continued)

(56) References Cited

U.S. PATENT DOCUMENTS

2010/0022053 A1 * 1/2010 Mund ................. B81C 1/00333
257/E21.499

FOREIGN PATENT DOCUMENTS

DE 102020131493 A1 6/2022

* cited by examiner

*Primary Examiner* — Moin M Rahman
(74) *Attorney, Agent, or Firm* — Murphy, Bilak & Homiller, PLLC

(57) ABSTRACT

A method for forming a power semiconductor module arrangement includes: arranging a housing on a substrate, the housing having sidewalls and being arranged to directly adjoin the substrate such that the substrate forms a ground surface of the housing; filling a liquid, viscous or semi-liquid UV-curable potting material into the housing so as to cover the substrate with the potting material; irradiating a first portion of the potting material in areas of the potting material near an interface between the substrate and the sidewalls so as to seal any gaps between the substrate and the sidewalls; and irradiating a second portion of the potting material farther away from the interface between the substrate and the sidewalls than the first portion of the potting material to form an encapsulant. Irradiation of the first and second portions of the potting material takes place at different times and/or via different radiation sources.

12 Claims, 2 Drawing Sheets

(51) Int. Cl.
*H10W 76/10* (2026.01)
*H10W 90/00* (2026.01)

(58) Field of Classification Search
CPC ........... H10W 90/791–798; H10W 72/20–287; H10W 72/012–01271; H10W 72/072–07261; H10W 72/07251–07255; H10W 90/721–7295; H10W 72/30–387; H10W 72/013–01371; H10W 72/073–07355; H10W 72/07351–07355; H10W 90/731–739; H10W 72/701–709; H10W 72/077; H10W 72/812; H10W 72/823; H10W 70/40–481; H10W 70/60; H10W 74/121; H10W 74/01; H10W 76/17; H10W 74/114; H10W 76/15; H10W 76/47; H10W 76/01; H10W 70/658; H10W 72/07331; H10W 72/352; H10W 90/734; H10W 72/074; H10W 72/07236; H10W 72/071; H10W 74/10; H04L 9/002; H01R 12/51
See application file for complete search history.

METHODS FOR FORMING A POWER SEMICONDUCTOR MODULE ARRANGEMENT

TECHNICAL FIELD

The instant disclosure relates to methods for forming a power semiconductor module arrangement, in particular to method for forming a power semiconductor module arrangement comprising an encapsulant.

BACKGROUND

Power semiconductor module arrangements often include a substrate within a housing. The substrate usually comprises a substrate layer (e.g., a ceramic layer), a first metallization layer deposited on a first side of the substrate layer and, optionally, a second metallization layer deposited on a second side of the substrate layer. A semiconductor arrangement including one or more controllable semiconductor elements (e.g., two IGBTs in a half-bridge configuration) may be arranged on the substrate. One or more terminal elements (contact elements), which allow for contacting such a semiconductor arrangement from outside the housing, are usually provided. Power semiconductor modules are known, where the terminal elements are arranged on the substrate and protrude in a direction that is essentially perpendicular to the main surface of the substrate through a cover of the housing. The section of the contact elements which protrudes out of the housing may be mechanically and electrically coupled to a printed circuit board. The housing may be glued to the substrate in order to remain in a desired position until the substrate is permanently attached to a base plate or heat sink by means of additional connecting elements. Gluing the housing to the substrate, however, requires additional pretreatment steps (e.g., a plasma treatment of the substrate), a step in which the glue is applied to the substrate, as well as a hardening step in which the originally viscous glue is hardened, thereby attaching the housing to the substrate. Each additional step during the assembly process requires additional process time and increases the overall cost of the power semiconductor module arrangement.

There is a need for a power semiconductor module arrangement that may be assembled in an effective and cost-efficient way.

SUMMARY

A method for forming a power semiconductor module arrangement includes arranging a housing on a substrate, wherein the housing includes sidewalls and is arranged to directly adjoin the substrate such that the substrate forms a ground surface of the housing, filling a liquid, viscous or semi-liquid UV-curable potting material into the housing, thereby covering the substrate with the potting material, irradiating a first portion of the potting material in areas of the potting material near an interface between the substrate and the sidewalls of the housing so as to seal any gaps between the substrate and the sidewalls of the housing, and irradiating a second portion of the potting material farther away from the interface between the substrate and the sidewalls of the housing than the first portion of the potting material to form an encapsulant, wherein irradiation of the first and second portions of the potting material takes place at different times and/or via different radiation sources.

Another method for forming a power semiconductor module arrangement includes applying a liquid, viscous or semi-liquid UV-curable potting material to a substrate, irradiating exterior sections along the edges of the substrate with ultraviolet light, thereby triggering a cross-linking of the potting material along the edges of the substrate and forming a dam extending circumferentially along the edges of the substrate, filling a volume defined by the dam with UV-curable potting material, and after forming the dam and filling a volume defined by the dam with UV-curable potting material, irradiating the volume of UV-curable potting material with ultraviolet light, thereby triggering a cross-linking process of the remaining potting material and forming an encapsulant covering the substrate.

The invention may be better understood with reference to the following drawings and the description. The components in the figures are not necessarily to scale, emphasis instead being placed upon illustrating the principles of the invention. Moreover, in the figures, like referenced numerals designate corresponding parts throughout the different views.

DETAILED DESCRIPTION

In the following detailed description, reference is made to the accompanying drawings. The drawings show specific examples in which the invention may be practiced. It is to be understood that the features and principles described with respect to the various examples may be combined with each other, unless specifically noted otherwise. In the description as well as in the claims, designations of certain elements as "first element", "second element", "third element" etc. are not to be understood as enumerative. Instead, such designations serve solely to address different "elements". That is, e.g., the existence of a "third element" does not require the existence of a "first element" and a "second element". A semiconductor body as described herein may be made from (doped) semiconductor material and may be a semiconductor chip or may be included in a semiconductor chip. A semiconductor body has electrically connecting pads and includes at least one semiconductor element with electrodes.

Figure 1:
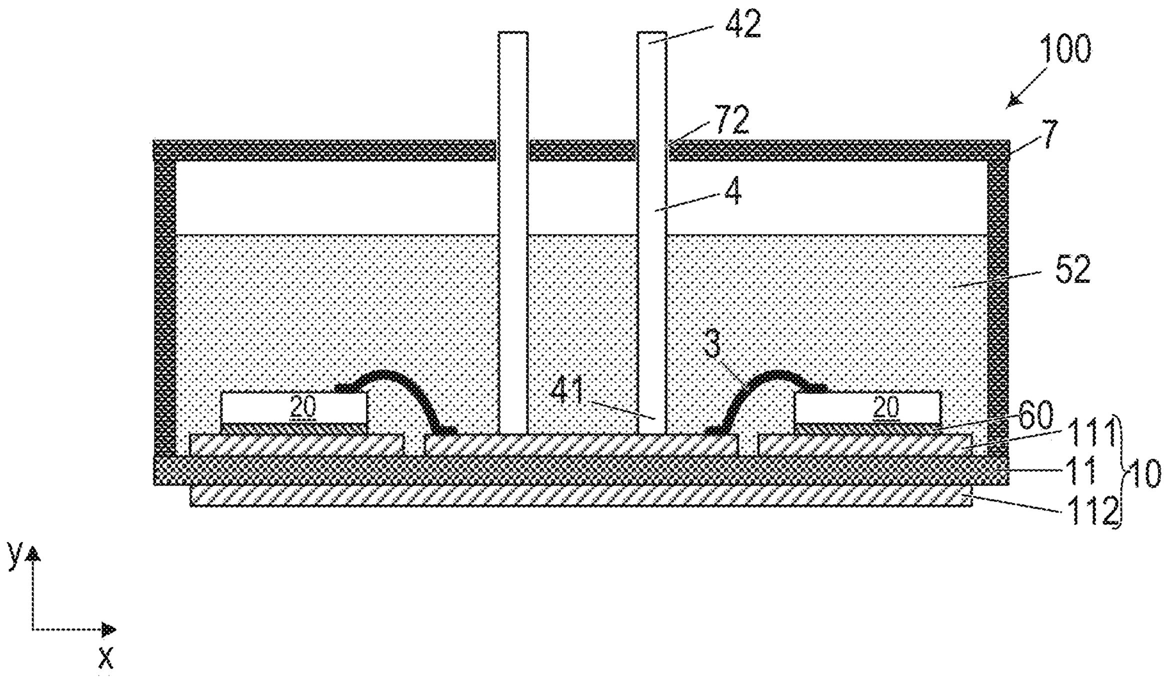
FIG. 1 is a cross-sectional view of a power semiconductor module arrangement.

Referring to FIG. 1, a cross-sectional view of a power semiconductor module arrangement 100 is illustrated. The power semiconductor module arrangement 100 includes a housing 7 and a substrate 10. The substrate 10 includes a dielectric insulation layer 11, a (structured) first metallization layer 111 attached to the dielectric insulation layer 11, and a (structured) second metallization layer 112 attached to the dielectric insulation layer 11. The dielectric insulation layer 11 is disposed between the first and second metallization layers 111, 112.

Each of the first and second metallization layers 111, 112 may consist of or include one of the following materials:

copper; a copper alloy; aluminum; an aluminum alloy; any other metal or alloy that remains solid during the operation of the power semiconductor module arrangement. The substrate 10 may be a ceramic substrate, that is, a substrate in which the dielectric insulation layer 11 is a ceramic, e.g., a thin ceramic layer. The ceramic may consist of or include one of the following materials: aluminum oxide; aluminum nitride; zirconium oxide; silicon nitride; boron nitride; or any other dielectric ceramic. Alternatively, the dielectric insulation layer 11 may consist of an organic compound and include one or more of the following materials: $Al_2O_3$, AlN, SiC, BeO, BN, or $Si_3N_4$. For instance, the substrate 10 may, e.g., be a Direct Copper Bonding (DCB) substrate, a Direct Aluminum Bonding (DAB) substrate, or an Active Metal Brazing (AMB) substrate. Further, the substrate 10 may be an Insulated Metal Substrate (IMS). An Insulated Metal Substrate generally comprises a dielectric insulation layer 11 comprising (filled) materials such as epoxy resin or polyimide, for example. The material of the dielectric insulation layer 11 may be filled with ceramic particles, for example. Such particles may comprise, e.g., $SiO_2$, $Al_2O_3$, AlN, SiN or BN and may have a diameter of between about 1 μm and about 50 μm. The substrate 10 may also be a conventional printed circuit board (PCB) having a non-ceramic dielectric insulation layer 11. For instance, a non-ceramic dielectric insulation layer 11 may consist of or include a cured resin.

The substrate 10 is arranged in a housing 7. In the example illustrated in FIG. 1, the substrate 10 forms a base surface of the housing 7, while the housing 7 itself solely comprises sidewalls and, optionally, a cover. In some power semiconductor module arrangements 100, more than one substrate 10 is arranged within the same housing 7.

One or more semiconductor bodies 20 may be arranged on the at least one substrate 10. Each of the semiconductor bodies 20 arranged on the at least one substrate 10 may include a diode, an IGBT (Insulated-Gate Bipolar Transistor), a MOSFET (Metal-Oxide-Semiconductor Field-Effect Transistor), a JFET (Junction Field-Effect Transistor), a HEMT (High-Electron-Mobility Transistor), or any other suitable semiconductor element.

The one or more semiconductor bodies 20 may form a semiconductor arrangement on the substrate 10. In FIG. 1, only two semiconductor bodies 20 are exemplarily illustrated. The second metallization layer 112 of the substrate 10 in FIG. 1 is a continuous layer. According to another example, the second metallization layer 112 may be a structured layer. According to other examples, the second metallization layer 112 may be omitted altogether. The first metallization layer 111 is a structured layer in the example illustrated in FIG. 1. "Structured layer" in this context means that the respective metallization layer is not a continuous layer, but includes recesses between different sections of the layer. Such recesses are schematically illustrated in FIG. 1. The first metallization layer 111 in this example includes three different sections. Different semiconductor bodies 20 may be mounted to the same or to different sections of the first metallization layer 111. Different sections of the first metallization layer may have no electrical connection or may be electrically connected to one or more other sections using electrical connections 3 such as, e.g., bonding wires. Semiconductor bodies 20 may be electrically connected to each other or to the first metallization layer 111 using electrical connections 3, for example. Electrical connections 3, instead of bonding wires, may also include bonding ribbons, connection plates or conductor rails, for example, to name just a few examples. The one or more semiconductor bodies 20 may be electrically and mechanically connected to the substrate 10 by an electrically conductive connection layer 60. Such an electrically conductive connection layer 60 may be a solder layer, a layer of an electrically conductive adhesive, or a layer of a sintered metal powder, e.g., a sintered silver (Ag) powder, for example.

The power semiconductor module arrangement 100 illustrated in FIG. 1 further includes terminal elements 4. The terminal elements 4 are mechanically and electrically connected to the substrate 10 (e.g., to the first metallization layer 111) and provide an electrical connection between the inside and the outside of the housing 7. The terminal elements 4 may be mechanically and electrically connected to the first metallization layer 111 with a first end 41, while a second end 42 of the terminal elements 4 protrudes out of the housing 7. The terminal elements 4 may be electrically contacted from the outside at their second end 42. The housing 7 may optionally be provided with a cover comprising a plurality of through holes 72 through which each of the plurality of terminal elements 4 vertically protrudes.

In addition to or instead of the terminal elements 4 described with respect to FIG. 1, the components inside the housing 7 may also be electrically contacted from outside the housing 7 in any other suitable way. For example, additional terminal elements 4 may be arranged closer to or adjacent to the sidewalls of the housing 7. It is also possible that terminal elements 4 protrude vertically or horizontally through the sidewalls of the housing 7. The first end 41 of a terminal element 4 may be electrically and mechanically connected to the substrate 10 by an electrically conductive connection layer, for example (not explicitly illustrated in FIG. 1). Such an electrically conductive connection layer may be a solder layer, a layer of an electrically conductive adhesive, or a layer of a sintered metal powder, e.g., a sintered silver (Ag) powder, for example. The first end 41 of a terminal element 4 may also be electrically coupled to the substrate 10 via one or more electrical connections 3, for example.

Power semiconductor module arrangements 100 often further include an encapsulant 52. The encapsulant 52 may consist of or include a silicone gel or may be a rigid molding compound, for example. The encapsulant 52 may at least partly fill the interior of the housing 7, thereby covering the components and electrical connections that are arranged on the substrate 10. The terminal elements 4 may be partly embedded in the encapsulant 52. At least their second ends 42, however, are not covered by the encapsulant 52 and protrude from the encapsulant 52 through the housing 7 to the outside of the housing 7. The encapsulant 52 is configured to protect the components and electrical connections of the power semiconductor module arrangement 100, in particular the components arranged on the substrate 10 inside the housing 7, from certain environmental conditions and mechanical damage.

The housing 7 may be glued to the substrate 10 in order to remain in a desired position until the substrate 10 is permanently attached to a base plate or heat sink by means of additional connecting elements. In particular, the housing 7 may be glued to the substrate 10 before filling a potting material 50 into the housing 7 which, after performing a hardening step, forms the encapsulant 52. The power semiconductor module arrangement 100 with the housing 7 glued to the substrate 10 and the encapsulant 52 arranged inside the housing 7 may then be shipped to a customer who then mounts the power semiconductor module arrangement 100 to a support structure such as a base plate or heat sink, for example. The power semiconductor module arrangement 100 may be mounted on a support structure (e.g., base plate or heat sink) by means of screws or bolts, for example, which serve to hold the substrate 10 in place and to force its lower surface into contact with the support structure. The glued joint between the housing 7 and the substrate 10 is therefore generally not needed to hold the housing 7 in its desired position with regard to the substrate 10 during operation of the power semiconductor module arrangement 100. The main purposes of the glued joint are to prevent the potting material 50 forming the encapsulant 52 from leaking out of the housing before being sufficiently hardened and to hold the housing 7 in its desired position with regard to the substrate 10 when shipping the power semiconductor module arrangement 100 to an end customer. Gluing the housing 7 to the substrate 10, however, requires additional pretreatment steps (e.g., a plasma treatment of the substrate 10), a step in which the glue is applied to the substrate 10, as well as a hardening step in which the originally viscous glue is hardened, thereby attaching the housing 7 to the substrate 10. Each additional step during the assembly process requires additional process time and increases the overall cost of the power semiconductor module arrangement 100.

In the following, methods for forming a power semiconductor module arrangement 100 according to embodiments of the disclosure will be described in which gluing the housing 7 to the substrate 10 is not required. That is, fewer steps are required for the methods described in the following, as compared to conventional methods. In this way, power semiconductor module arrangements can be assembled in a very effective and cost-efficient way. This is, because each additional step of the conventional methods requires time and adds to the overall production costs of a power semiconductor module arrangement 100.

A method for forming a power semiconductor module arrangement 100 according to embodiments of the disclosure comprises arranging a housing 7 on a substrate 10. The housing 7 may be attached to the substrate 10 in any suitable way without a glued joint between the sidewalls of the housing 7 and the substrate 10. For example, the housing 7 may be attached to the substrate 10 solely by means of a mechanical connection. Such a mechanical connection may be implemented in any suitable way. The mechanical connection may be sufficient to attach the housing to the substrate 10 while forming the encapsulant 52 and when shipping the power semiconductor module arrangement 100 to an end customer. For example, the power semiconductor module arrangement 100 may comprise specific holding pins that are arranged on the substrate 10 and extend from the substrate 10 in a vertical direction y towards the cover of the housing 7. The cover of the housing 7 may comprise holding elements (e.g., sleeves) that are configured to receive a free end of the holding pins, thereby forming a force-fitting connection. Additionally or alternatively it is also possible, for example, that one or more of the terminal elements 4 comprise a holding element arranged between the first end 41 and the second end 42 that is arranged inside a through hole in the cover of the housing 7, wherein each holding element exerts a force on the housing, thereby holding the housing in a desired position with regard to the substrate 10. Additionally or alternatively, a simple removable clamping mechanism could be used to hold the assembly together. Such mechanical connections, however, are only examples. A mechanical connection between the housing 7 and the substrate 10 may also be formed in any other suitable way.

Figure 2:
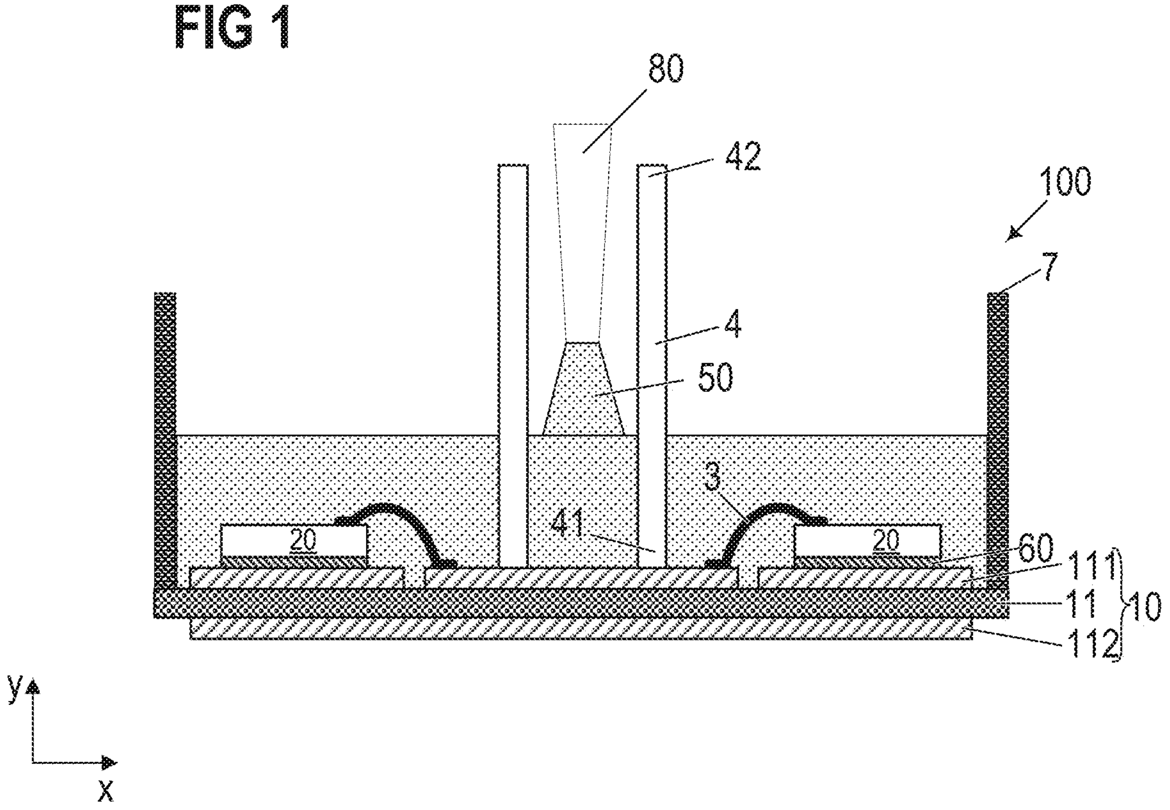
FIG. 2 schematically illustrates a step of a method for forming a power semiconductor module arrangement according to embodiments of the disclosure.

As there is no glue between the housing 7 and the substrate 10, the sidewalls of the housing 7 (i.e. the lower surfaces of the sidewalls facing the substrate 10) are arranged on the substrate 10 to directly adjoin the substrate 10 (i.e. a top surface of the substrate 10, wherein the top surface of the substrate 10 may be a top surface of the dielectric insulation layer 11 or a top surface of the first metallization layer 111, wherein the top surface of the dielectric insulation layer 11 is a surface facing the first metallization layer 111, and the top surface of the first metallization layer 111 is a surface the semiconductor bodies 20 and any other elements of the power semiconductor module arrangement 100 are mounted to). However, when mounting the housing 7 to the substrate 10 without a glued joint between the housing 7 and the substrate 10, there is a risk that a potting material 50 that is filled into the housing 7 to form the encapsulant leaks out of the housing 7. Small gaps may be present at an interface between the housing 7 and the substrate 10. The potting material 50 that is filled into the housing 7 to form the encapsulant 52 is generally liquid, viscous or semi-liquid before it is hardened to form the encapsulant 52. The potting material 50 at least partly fills the housing 7 and covers the substrate 10 and most components mounted thereon, as is schematically illustrated in FIG. 2. As has been described above, the terminal elements 4, for example, are generally not entirely covered by the potting material 50 and the encapsulant 52, respectively. The step of filling the potting material 50 into the housing 7, e.g., by means of a dispensing equipment 80, is schematically illustrated in FIG. 2. According to some embodiments of the disclosure, the dispensing equipment 80 may be arranged centrally above the substrate 10. That is, the potting material 50 is dispensed centrally on the substrate 10 and, from there, spreads towards the edges of the substrate 10.

Figure 3:
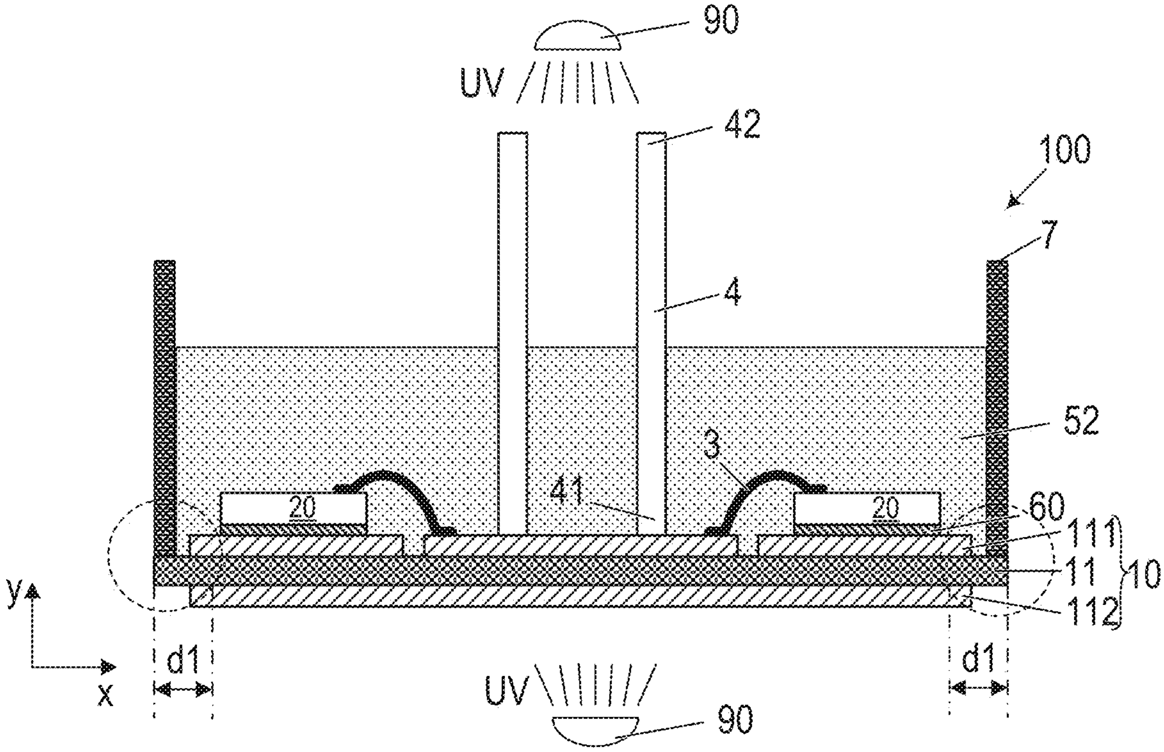
FIG. 3 schematically illustrates another step of a method for forming a power semiconductor module arrangement according to embodiments of the disclosure.

The potting material 50 is a UV-curable material. UV-curable materials typically include a photoinitiator which, when exposed to UV (ultraviolet) light, initiates cross-linking of the UV-curable material 50, causing it to harden. UV curable materials typically cure significantly more quickly than non-UV-curable materials. After dispensing the potting material 50 into the module housing 7 as shown in FIG. 2, a UV light source 90 may be arranged above the module as shown in FIG. 3, thereby irradiating the UV-curable potting material 50 inside the housing 7 and causing it to harden rapidly. This part of the process is typically performed with no lid on top of the housing 7, of course, so that the UV light is able to reach the UV-curable potting material 50.

The UV-curable potting material 50 has a defined viscosity. The viscosity generally depends on the specific potting material 50 that is used to form the encapsulant 52. Such materials may, for example, take the form of epoxy resins or silicone gels. A liquid, viscous or semi-liquid UV-curable potting material that is suited to form the encapsulant 52 may have a viscosity of at least 900 mPa*s, for example. Some UV-curable potting materials 50 may have a viscosity of 925 mPa*s, others may have a viscosity of 1000 mPa*s, and some may have a viscosity of 8000 mPa*s, for example. Any other viscosity is generally possible. The higher the viscosity of the potting material 50, the lower its fluidity. Viscosity generally is the resistance of a material to a change in shape, or movement of neighboring portions relative to one another. Viscosity denotes opposition to flow. The reciprocal of the viscosity is called the fluidity, a measure of the case of flow. A potting material 50 having a lower viscosity will leak out of the housing 7 faster than a potting material 50 having a higher viscosity. Generally, there may be significant leakage already within a very short timeframe, e.g., within several tens of seconds, one minute, or two minutes, for example, even when relatively fast-curing UV-curable potting materials are used.

In order to prevent the UV-curable potting material 50 from leaking out of the housing 7, at least parts of the power semiconductor module arrangement 100 may be irradiated with ultraviolet light, thereby triggering a cross-linking of the potting material 50. In particular, a first portion of the potting material 50 may be irradiated in areas of the potting material 50 near an interface between the substrate 10 and the sidewalls of the housing 7 so as to seal any gaps between the substrate 10 and the sidewalls of the housing 7. "Near" in this respect refers to any portion of the potting material 50 within a radius of, e.g., up to 5 mm (millimeters), up to 10 mm, up to 20 mm, or even up to 30 mm, around the interface between the substrate 10 and the sidewalls of the housing 7. This is schematically illustrated in FIG. 3. At least an edge region (first portion indicated in dashed circles in FIG. 3) of the substrate 10 may be irradiated with ultraviolet light, such that a cross-linking of the potting material 50 is triggered primarily in areas of the potting material 50 that are closest to the sidewalls of the housing 7. The areas closest to where the sidewalls of the housing 7 contact the substrate 10 are the areas where the potting material 50 may potentially leak out of the housing 7. By starting the cross-linking process specifically in these areas, the cross-linked potting material 50 itself forms a barrier, seals any gaps between the substrate 10 and the sidewalls of the housing 7, and prevents any potting material 50 that has not yet been cross-linked from leaking out of the housing 7. The viscosity of the potting material 50 increases rapidly once the cross-linking has been triggered by means of the ultraviolet light. The potting material 50 may change from a liquid, viscous or semi-liquid state to a cured, pasty, hardened or solid state when the cross-linking takes place. The method further comprises irradiating a second portion of the potting material 50 farther away from the interface between the substrate 10 and the sidewalls of the housing 7 than the first portion of the potting material 50 to form an encapsulant 52, wherein irradiation of the first and second portions of the potting material takes place at different times and/or via different radiation sources.

The encapsulant 52 is formed by sufficiently hardening the first and second portion of the potting material 50. This may be achieved solely by irradiating the potting material 50 with ultraviolet light. It is, however, also possible that additional hardening steps follow an initial cross-linking process. An additional hardening process may comprise an additional irradiating step, wherein the additional irradiating step comprises irradiating the entire power semiconductor module arrangement 100 with ultraviolet light. It is, however, also possible that the power semiconductor module arrangement 100 is exposed to humidity during an additional hardening process.

Irradiating the power semiconductor module arrangement 100 (e.g., the first portion and/or the second portion of the potting material 50) may comprise irradiating the power semiconductor module arrangement 100 by means of an ultraviolet light source 90 arranged on a side of the substrate 10 that faces the housing 7 (UV light source 90 arranged above the power semiconductor module arrangement 100 in FIG. 3). In this case, it may be advantageous to first dispense only a thin layer of potting material 50 on the substrate 10, sufficient to cover the interface between the housing 7 and substrate 10, then to irradiate this thin layer near the edges of the substrate 10 to harden the potting material 50 and seal the interface. Then the housing 7 can be filled with potting material 50 to a final desired level before irradiating the remaining potting material to rapidly cure it. Alternatively or additionally, irradiating the power semiconductor module arrangement 100 (e.g., the first portion and/or the second portion of the potting material 50) may comprise irradiating the power semiconductor module arrangement 100 by means of an ultraviolet light source 90 arranged on a side of the substrate 10 that faces away from the housing 7 (UV light source 90 arranged below the power semiconductor module arrangement 100 in FIG. 3). It is generally possible that the entire power semiconductor module arrangement 100 is equally irradiated by the ultraviolet light. It is, however, generally sufficient to at least irradiate those areas that are closest to the edges of the substrate 10, in order to form a barrier and seal the housing before any potting material 50 can leak out of the housing 7. For example, at least areas within a defined distance or radius d1 from or around the edges of the substrate 10 may be irradiated. The defined distance d1 may be, e.g., up to 1 cm, up to 2 cm or up to 3 cm. The housing 7 may contact the substrate 10 within this defined distance d1. Once the cross-linking of the potting material 50 has been triggered, any gaps between the housing 7 and the substrate 10 are sealed solely by means of the resulting encapsulant 52 formed by cross-linking the potting material 50.

A time that passes between the step of filling the potting material 50 into the housing 7 (filling the potting material 50 into the housing 7 has been completed) and the step of irradiating the first portion of the potting material 50 may depend on the fluidity (or viscosity) of the potting material 50. That is, if the fluidity is high (viscosity is low) the time that passes between filling the potting material 50 into the housing 7 and irradiating the first portion of the potting material 50 may be comparably short, as the potting material 50 may leak out of the housing 7 comparably fast. If, on the other hand, the fluidity is low (viscosity is high) the time that passes between filling the potting material 50 into the housing 7 and irradiating the first portion of the potting material 50 may be comparably long, as the potting material 50 may not leak out of the housing 7 very fast. Generally, the time that passes between filling the potting material 50 into the housing 7 and irradiating the first portion of the potting material 50 may be zero seconds, up to 30 s (seconds), up to one minute or in few cases even up to several minutes, depending on the fluidity of the respective potting material 50. For example, the time that passes between filling the potting material 50 into the housing 7 and irradiating the first portion of the potting material 50 may be less than five minutes. However, this irradiation step generally takes significantly less time than the gluing and glue curing steps associated with conventional assembly processes, even when low fluidity gels are used.

Irradiating the exterior of the semiconductor module housing 7 and of the UV-curable potting material 50 inside the housing 7 may take place simultaneously. Because the volume of the material 50 inside the housing 7 is far greater than the volume of potting material 50 emerging at the interface between the housing 7 and substrate 10, however, curing at the interface (first portion of potting material 50) will complete more rapidly at the external locations. The semiconductor module may be irradiated by a UV light source 90 beneath the module and by a further UV light source 90 above the module, for example. Once curing is complete at the interface between the housing 7 and substrate 10, the UV light source 90 beneath the module may be switched off, while the UV light source 90 above the housing may remain on until the UV-curable potting material 50 inside the housing 7 (second portion of potting material 50) is fully cured.

The method for forming a power semiconductor module arrangement according to the embodiments described above requires less manufacturing steps than conventional methods. The method, therefore, requires less manufacturing time and is therefore very cost-effective. Any thermal stress which may arise during the step of hardening a glue that attaches the housing 7 to the substrate 10 is entirely avoided by the methods described herein. Methods for forming a power semiconductor module arrangement 100 comprising a housing 7 have been described with respect to FIGS. 1 to 3 above. It is, however, also possible to form a power semiconductor module arrangement 100 without a housing 7 similar to what has been described above.

Figure 4:
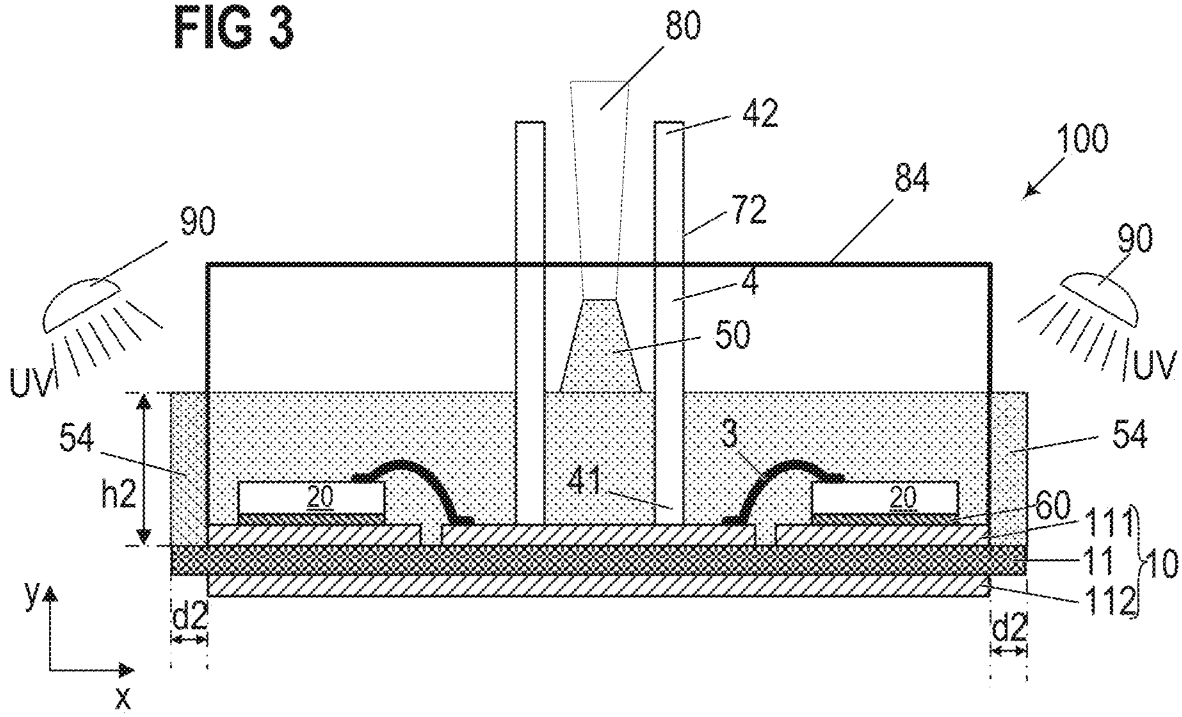
FIG. 4 schematically illustrates a step of another method for forming a power semiconductor module arrangement according to embodiments of the disclosure.

Now referring to FIG. 4, methods for forming a power semiconductor module arrangement 100 without a housing 7 according to embodiments of the disclosure will be described in more detail. The power semiconductor module arrangement 100 as illustrated in FIG. 4 comprises a substrate 10 with semiconductor bodies 20 and additional elements (e.g., terminal elements 4, or electrical connections 3) arranged thereon. An encapsulant 52 is formed on the substrate 10 by applying a UV-curable potting material 50 to the substrate 10, similar to what has been described above (e.g., by means of a dispensing equipment 80). According to some embodiments of the disclosure, the dispensing equipment 80 may be arranged centrally above the substrate 10. That is, the potting material 50 is dispensed centrally on the substrate 10 and, from there, spreads towards the edges of the substrate 10. The exterior sections along the edges of the substrate 10 are irradiated with ultraviolet light (e.g., by means of one or more ultraviolet light sources 90) such that a cross-linking of the UV-curable potting material 50 is triggered as soon as it reaches the edges of the substrate 10. In this way, a barrier or dam 54 is formed that extends circumferentially along the edges of the substrate 10 which prevents the still liquid, viscous or semi-liquid UV-curable potting material 50 in the central areas of the substrate 10 (inside the volume defined by the dam 54) from flowing off the substrate 10. The central areas of the substrate 10, however, are not initially irradiated with ultraviolet light such that the potting material 50 inside the dam 54 can still freely flow inside the volume defined by the dam 54, forming an even layer of potting material 50 within the dam 54. The dam 54 may be formed to have a thickness d2 in a horizontal direction of between 0.5 cm and 3 cm, or between 1 cm and 2 cm, for example.

A shading tool or masking tool 84 may be arranged above the substrate 10 (e.g., on a side of the substrate 10 from where the potting material 50 is applied), in order to prevent any ultraviolet light from reaching the central area of the substrate 10. One or more ultraviolet light sources 90 may be arranged on the same side of the substrate 10 as the shading or masking tool 84, wherein the shading or masking tool 84 is arranged between the one or more light sources 90 and the substrate 10.

When the dam 54 formed by the cross-linked potting material 50 along the edges of the substrate 10 has been formed and has a desired height h2 (e.g., up to several centimeters) in a vertical direction y, and the volume inside of the dam 54 has been filled with further UV-curable potting material 50, the remaining areas of the substrate 10 may be irradiated with ultraviolet light, thereby triggering a cross-linking of the remaining potting material 50, and forming the encapsulant 52.

According to some embodiments, a housing is arranged on the substrate 10 once the encapsulant 52 has been formed. It is, however, also possible that no housing 7 is mounted to the substrate 10. If, for example, the encapsulant 52 is sufficiently hard (e.g., rigid molding compound), the encapsulant 52 alone may be sufficient in order to protect the substrate 10 and the components mounted thereon from any mechanical damage and any environmental conditions.

Summarizing the above, a method for forming a power semiconductor module arrangement 10 according to embodiments of the disclosure comprises applying a liquid, viscous or semi-liquid UV-curable potting material 50 to a substrate 10, irradiating exterior sections along the edges of the substrate 10 with ultraviolet light, thereby triggering a cross-linking of the potting material 50 along the edges of the substrate 10 and forming a dam 54 extending circumferentially along the edges of the substrate 10, filling a volume defined by the dam 54 with UV-curable potting material 50, and, after forming the dam 54 and filling a volume defined by the dam 54 with potting material 50, irradiating the volume of UV-curable potting material 50 with ultraviolet light, thereby triggering a cross-linking process of the remaining potting material 50 and forming an encapsulant 52 covering the substrate 10.

Depending on the specific materials used as a potting material 50, a cross-linking may be triggered within less than 10 seconds, less than 5 seconds or even within 1 second or less when the potting material 50 is irradiated with ultraviolet light. That is, the cross-linking is started (almost) instantaneously. This is generally not the case when the potting material 50 is hardened by means of a thermal process (e.g., by heating the potting material 50 to a defined temperature). Cross-linking the potting material 50 by means of conventional thermal processes generally requires several minutes or even up to several hours. Once the cross-linking has been triggered, the potting material 50 remains in its current position and any further flow of the potting material 50 is prevented. The methods described above by means of FIGS. 1 to 4 may be performed in a vacuum chamber, for example. In particular, at least one of the irradiating steps may be performed in a vacuum chamber.

The invention claimed is:

1. A method for forming a power semiconductor module arrangement, the method comprising:

arranging a housing on a substrate, wherein the housing comprises sidewalls and is arranged to directly adjoin the substrate such that the substrate forms a ground surface of the housing;

filling a liquid, viscous or semi-liquid UV-curable potting material into the housing, so as to cover the substrate with the potting material;

irradiating a first portion of the potting material in areas of the potting material near an interface between the substrate and the sidewalls of the housing, so as to seal any gaps between the substrate and the sidewalls of the housing; and irradiating a second portion of the potting material farther away from the interface between the substrate and the sidewalls of the housing than the first portion of the potting material to form an encapsulant, wherein the irradiating of the first and second portions of the potting material takes place at different times and/or via different radiation sources.

2. The method of claim 1, wherein the irradiating of the first portion of the potting material is performed by an ultraviolet light source arranged on a side of the substrate that faces away from the housing.

3. The method of claim 1, wherein the irradiating of the second portion of the potting material is performed by an ultraviolet light source arranged on a side of the substrate that faces the housing.

4. The method of claim 1, wherein the potting material has a defined viscosity, and wherein a time that passes between the filling of the potting material into the housing and the irradiating of the first portion of the potting material depends on the viscosity of the potting material.

5. The method of claim 4, wherein the time that passes is less than five minutes.

6. The method of claim 1, wherein the filling of potting material into the housing comprises filling a potting material into the housing that has a viscosity of at least 900 mPa*s.

7. The method of claim 1, further comprising:
after forming the encapsulant by cross-linking the potting material, performing an additional hardening process to further harden the encapsulant.

8. The method of claim 1, wherein the arranging of the housing on the substrate comprises attaching the housing to the substrate by a mechanical connection such that the housing is attached to the substrate solely by the mechanical connection.

9. The method of claim 1, wherein at least one of the irradiating of the first portion of the potting material and the irradiating of the second portion of the potting material is performed in a vacuum chamber.

10. A method for forming a power semiconductor module arrangement, the method comprising:
applying a liquid, viscous or semi-liquid UV-curable potting material to a substrate;
irradiating exterior sections along edges of the substrate with ultraviolet light, so as to trigger a cross-linking of the potting material along the edges of the substrate and form a dam extending circumferentially along the edges of the substrate;
filling a volume defined by the dam with UV-curable potting material; and
after forming the dam and filling a volume defined by the dam with the UV-curable potting material, irradiating the volume of UV-curable potting material with ultraviolet light so as to trigger a cross-linking process of the remaining potting material and form an encapsulant covering the substrate.

11. The method of claim 10, wherein the dam is formed to have a thickness in a horizontal direction of between 0.5 cm and 3 cm, or between 1 cm and 2 cm.

12. The method of claim 11, wherein the thickness is between 1 cm and 2 cm.

* * * * *